US010882781B2

(12) United States Patent
Kharchenko et al.

(10) Patent No.: US 10,882,781 B2
(45) Date of Patent: Jan. 5, 2021

(54) METHOD FOR OBTAINING A SUBSTRATE COATED WITH A FUNCTIONAL LAYER BY USING A SACRIFICIAL LAYER

(71) Applicant: SAINT-GOBAIN GLASS FRANCE, Courbevoie (FR)

(72) Inventors: Andriy Kharchenko, Palaiseau (FR); Bernard Nghiem, Arsy (FR); Nicolas Nadaud, Paris (FR); Lorenzo Canova, Paris (FR); Arnaud Huignard, Compiegne (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 477 days.

(21) Appl. No.: 15/316,284

(22) PCT Filed: Jun. 2, 2015

(86) PCT No.: PCT/FR2015/051451
§ 371 (c)(1),
(2) Date: Dec. 5, 2016

(87) PCT Pub. No.: WO2015/185848
PCT Pub. Date: Dec. 10, 2015

(65) Prior Publication Data
US 2018/0141858 A1 May 24, 2018

(30) Foreign Application Priority Data
Jun. 6, 2014 (FR) ...................... 14 55151

(51) Int. Cl.
*C03C 23/00* (2006.01)
*C03C 17/00* (2006.01)
*C03C 17/36* (2006.01)
*C03C 17/25* (2006.01)
*C03C 17/23* (2006.01)
*C23C 14/58* (2006.01)

(52) U.S. Cl.
CPC ........ *C03C 23/0025* (2013.01); *C03C 17/002* (2013.01); *C03C 17/007* (2013.01); *C03C 17/23* (2013.01); *C03C 17/25* (2013.01); *C03C 17/366* (2013.01); *C03C 17/3607* (2013.01); *C03C 17/3649* (2013.01); *C03C 17/3652* (2013.01); *C03C 17/3681* (2013.01); *C03C 17/3689* (2013.01); *C03C 23/0005* (2013.01); *C03C 23/007* (2013.01); *C23C 14/5813* (2013.01); C03C 2217/212 (2013.01); C03C 2217/213 (2013.01); C03C 2217/425 (2013.01); C03C 2217/71 (2013.01); C03C 2217/73 (2013.01); C03C 2217/732 (2013.01); C03C 2218/113 (2013.01); C03C 2218/156 (2013.01); C03C 2218/32 (2013.01); C03C 2218/328 (2013.01); C03C 2218/355 (2013.01)

(58) Field of Classification Search
CPC ............ C03C 23/0025; C03C 23/0005; C03C 23/007; C03C 17/002; C03C 17/007; C03C 17/23; C03C 17/25; C03C 17/3607; C03C 17/3649; C03C 17/3652; C03C 17/366; C03C 17/3681; C03C 17/3689; C23C 14/5813
See application file for complete search history.

(56) References Cited

U.S. PATENT DOCUMENTS

| 8,221,832 | B2* | 7/2012 | Murphy | .............. | C03C 17/3423 204/192.1 |
|---|---|---|---|---|---|
| 9,580,807 | B2* | 2/2017 | Bilaine | .............. | B23K 26/0608 |
| 2005/0181219 | A1 | 8/2005 | Depauw et al. | | |
| 2008/0182032 | A1 | 7/2008 | Krasnov et al. | | |
| 2009/0123654 | A1 | 5/2009 | Petrmichl et al. | | |
| 2010/0071810 | A1 | 3/2010 | Nadaud et al. | | |
| 2010/0101649 | A1 | 4/2010 | Huignard et al. | | |

(Continued)

FOREIGN PATENT DOCUMENTS

FR 2 971 960 A1 8/2012
FR 2 976 577 A1 12/2012
(Continued)

OTHER PUBLICATIONS

International Search Report dated Sep. 11, 2015 in PCT/FR2015/051451 filed Jun. 2, 2015.
(Continued)

*Primary Examiner* — Michael P Wieczorek
(74) *Attorney, Agent, or Firm* — Oblon, McClelland, Maier & Neustadt, L.L.P.

(57) ABSTRACT

The invention relates to a process for obtaining a material comprising a substrate coated on at least one part of at least one of its faces with at least one functional layer, said process comprising:
a step of depositing the or each functional layer, then
a step of depositing a sacrificial layer on said at least one functional layer, then
a step of heat treatment by means of radiation chosen from laser radiation or radiation from at least one flash lamp, said radiation having at least one treatment wavelength between 200 and 2500 nm, said sacrificial layer being in contact with the air during this heat treatment step, then
a step of removing the sacrificial layer using a solvent, said sacrificial layer being a monolayer and being such that, before heat treatment, it absorbs at least one part of said radiation at said at least one treatment wavelength and that, after heat treatment, it is capable of being removed by dissolution and/or dispersion in said solvent.

17 Claims, No Drawings

(56) References Cited

U.S. PATENT DOCUMENTS

| | | |
|---|---|---|
| 2012/0009388 A1 | 1/2012 | Varaprasad et al. |
| 2012/0052212 A1 | 3/2012 | Petrmichl et al. |
| 2013/0115468 A1* | 5/2013 | Kharchenko ............ B05D 5/12 |
| | | 428/426 |
| 2014/0059878 A1 | 3/2014 | Bilaine et al. |
| 2014/0120341 A1 | 5/2014 | Kharchenko et al. |
| 2014/0272465 A1 | 9/2014 | Lienhart et al. |

FOREIGN PATENT DOCUMENTS

| | | |
|---|---|---|
| FR | 2 981 346 A1 | 4/2013 |
| WO | WO-2012120238 A1 * | 9/2012 ......... B23K 26/0608 |

OTHER PUBLICATIONS

French Preliminary Search Report dated Jan. 21, 2015 in French Application 1455151, filed Jun. 6, 2014.

\* cited by examiner

METHOD FOR OBTAINING A SUBSTRATE COATED WITH A FUNCTIONAL LAYER BY USING A SACRIFICIAL LAYER

CROSS REFERENCE TO RELATED APPLICATION

This application is a National Stage entry under 35 USC 371 of PCT/FR2015/051451, filed on Jun. 2, 2015 and claims priority to French Patent Application No. 1455151, filed on Jun. 6, 2014.

The invention relates to the obtaining of substrates coated with at least one functional layer.

Some functional layers require heat treatments, either to improve their properties, or even to confer on them their functionality. By way of examples, mention may be made of low-emissivity functional layers based on silver or on transparent conductive oxides (TCOs), the emissivity and electrical resistivity of which are lowered following heat treatments. Photocatalytic layers based on titanium oxide are also more active after hear, treatment, since said treatment promotes crystal growth. Heat treatments also make it possible to create porosity in silica-based layers in order to reduce their light reflection factor.

A method for heat treatment by means of radiation, in particular infrared laser radiation focused on the layer, is known from application WO 2010/139908. Such a treatment makes it possible to very rapidly heat the layer without significantly heating the substrate. Typically, the temperature at any point on the face of the substrate opposite the face bearing the layer does not exceed 150° C., or even 100° C., during the treatment. Other types of radiation, such as that from flash lamps, can also be used for the same purpose.

However, some layers absorb infrared radiation very little, such that the major part of the energy of the radiation passes through the material without significantly heating it. The known processes cannot therefore be used.

Application WO 2012/022874 describes a process in which a soluble layer based on halides or sulfates is deposited on the layer to be treated, and can be overlaid with a layer which absorbs infrared radiation.

The objective of the present invention is to improve techniques of this type by providing a simplified process in which a single layer, applied to the substrate before heat treatment, acts both as a sacrificial layer and as an absorbent layer. The applicant has in fact discovered that certain materials, capable of absorbing light and infrared radiation and of releasing it in the form of heat to the underlying layers, are, after heat treatment, soluble or dispersible in aqueous or alcoholic solvents and consequently do not require the presence of a soluble underlayer in order to be able to be removed by washing after treatment.

A subject of the present invention is therefore a process for obtaining a material comprising at substrate coated on at least one part of at least one of its faces with at least one functional layer, said process comprising:
a step of depositing the or each functional layer, then
a step of depositing a sacrificial layer on said at least one functional layer, then
a step of heat treatment by means of radiation chosen from laser radiation or radiation from at least one flash lamp, said radiation having at least one treatment wavelength between 200 and 2500 nm, said sacrificial layer being in contact with the air during this heat treatment step, then
a step of removing the sacrificial layer using a solvent.

The sacrificial layer is advantageously a monolayer and is such that, before heat treatment, it is capable of absorbing at least one part of said radiation at said at least one treatment wavelength and that, after heat treatment, it is capable of being removed by dissolution and/or dispersion in said solvent.

A subject of the invention is also a material which can be obtained by means of the process according to the invention.

All the characteristics or all the embodiments described hereinafter apply both to the process and to the material obtained.

The process according to the invention makes it possible to improve the efficiency of the heat treatment by means of an absorbent sacrificial layer, which is subsequently removed by means of a solvent. The use of a monolayer sacrificial coating makes it possible to provide a process which is simple and inexpensive compared with the use of multilayer sacrificial coatings as described in WO 2012/022874.

The solvent is advantageously aqueous. It may, for example, be water, in particular acidified water, for example acidified using acetic acid, citric acid or any other acid. The solvent may also be an alcohol, for example ethanol or propanol.

The step of removing the sacrificial layer implements contact of the sacrificial layer with the solvent. This contact may or may not be accompanied by an automated or manual mechanical treatment of the sacrificial layer, for example by means of brushes, cloths, etc. The step of removing the sacrificial layer may, for example, be carried out in a glass-washing apparatus, in particular of the type commonly used in glass manufacture or conversion workshops. The step of removing the sacrificial layer may in particular be carried out in a glass-washing machine.

The step of removing the sacrificial layer may be carried out just after the heat treatment step, in proximity to the heat treatment apparatus.

The removing step may alternatively be carried out subsequently or remotely from the heat treatment apparatus. The sacrificial layer may in fact act as mechanical protection for the functional layer during the transportation or handling thereof. By way of example, when the material is intended to be used in the manufacture of glazing, the material may be delivered, to a conversion workshop, still coated with its sacrificial layer, and the sacrificial layer may be removed in this workshop, either before the conversion step (cutting, insertion in insulating glazing, etc) or during or at the end of the conversion.

The substrate is preferably made of glass or of glass-ceramic. It is preferably transparent, colorless (it is then a clear or extra-clear glass) or colored, for example blue, gray, green or bronze. The term "extra-clear glass" is intended to mean a glass of which the weight content of iron oxide is at most 0.02% and of which the light transmission factor is at least 90%. The glass is preferably of soda-lime-silica type, but it may also be glass of borosilicate or aluminoborosilicate type, in particular for high-temperature applications (oven doors, chimney inserts, fire-resistant glazing). The substrate advantageously has at least one dimension greater than or equal to 1 m, or even 2 m and even 3 m. The thickness of the substrate generally ranges between 0.1 mm and 19 mm, preferably between 0.7 and 9 mm, in particular between 1 and 6 mm, or even between 2 and 4 mm.

The glass substrate is preferably of float glass type, that is to say capable of having been obtained by a process that consists in pouring the molten glass onto a bath of molten tin ("float" bath). In this case, the coating to be treated may equally be deposited on the "tin" face as on the "atmosphere" face of the substrate. The terms "atmosphere" and "tin" faces are intended to mean the faces of the substrate that have respectively been in contact with the atmosphere prevailing in the float bath and in contact with the molten tin. The tin side contains a small superficial amount of tin that has diffused into the structure of the glass. The glass substrate may also be obtained by rolling between two rolls, a technique that makes it possible in particular to imprint patterns onto the surface of the glass.

The expression "on" or "on top of" should be intended to mean that the sacrificial layer is further from the substrate than the functional layer. This expression does not, however, prejudge any direct contact between the two layers.

The sacrificial layer preferably absorbs at least one part of the radiation at at least one treatment wavelength between 800 and 1300 nm. Preferably, the absorption by the sacrificial layer at at least one treatment wavelength is at least 15%, in particular 20% and even 25% or 30%. The absorption may, in a known manner, be deduced from measurements carried out using a spectrophotometer.

The absorption of the or each functional layer at the or each treatment wavelength is preferably at most 10%, in particular 5%. It is in particular for layers of this type that the recourse to an absorbent sacrificial layer is the most useful.

The functional layer preferably gives the coated substrate at least one functionality chosen from a low emissivity, a low electrical resistivity, an antireflection effect, or a self-cleaning or easy-cleaning function.

The functional layer may be the only layer deposited on the substrate (in addition to the sacrificial layer). Alternatively, the functional layer may be included in a stack of thin layers. In the rest of the text, the assembly comprising the functional and sacrificial layer(s) and also, where appropriate, any other layer deposited on the same face of the substrate, is described as "coating".

The physical thickness of the or of each functional layer is typically between 1 nm and 5 µm, in particular between 2 nm and 2 µm, more particularly between 10 nm and 1 µm.

According to one preferred embodiment, the (or at least one) functional layer is a silica-based layer. Layers of this type do not absorb very much in the wavelength range under consideration, in particular in the near infrared, so that, in the absence of absorbent sacrificial layer, the heat treatment is ineffective.

The silica-based layer preferably, after heat treatment, essentially consists or even consists of silica. The silica-based layer is advantageously an antireflection layer, in the sense that the light reflection factor on the layer side is at most 6%, in particular 5% after heat treatment, when the layer is deposited on a single face of the substrate (the value therefore takes into account the reflection of the uncoated opposite face, which is approximately 4%).

According to a first variant, the silica-based layer comprises, before heat treatment, silicon, oxygen, carbon and optionally hydrogen, the latter two elements being at least partially removed during the heat treatment so as to obtain a porous layer essentially consisting of silica. This layer is preferentially deposited by magnetron sputtering of a silicon or silica target or by plasma-enhanced chemical vapor deposition using, as silicon precursor, an organometallic compound such as, for example, hexamethyldisiloxane.

According to a second variant, the silica-based layer comprises, before heat treatment, a silica matrix and pore-forming agents, the latter being removed during the heat treatment so as to obtain a porous layer essentially consisting of silica. The pore-forming agents are preferably organic, in particular polymeric, for example made of poly (methyl methacrylate), their average size preferably being included in a range from 20 to 200 nm. This layer is preferentially deposited by means of a process of the sol-gel type.

According to another preferred embodiment, the (or at least one) functional layer is a layer based on titanium oxide, in particular a layer consisting or essentially consisting of titanium oxide.

The thin layers based on titanium oxide have the distinctive feature of being self-cleaning, by facilitating the degradation of organic compounds under the action of ultraviolet radiation (photocatalysis phenomenon) and the removal of mineral soiling (dust) under the action of water runoff. Titanium dioxide crystallized in anatase form is much more effective in terms of degradation of organic compounds than amorphous titanium dioxide or titanium dioxide crystallized in rutile or brookite form. The titanium oxide may optionally be doped with a metal ion, for example an ion of a transition metal, or with nitrogen, carbon, fluorine, etc, atoms. The titanium oxide may also be sub-stoichiometric or superstoichiometric with respect to oxygen ($TiO_2$ or $TiO_x$).

The layer based on titanium oxide is preferentially deposited by magnetron sputtering. However, this technique does not make it possible to obtain very active layers, since the titanium oxide that they contain is not very crystalline or even is not crystalline. The heat treatment is then required to confer appreciable self-cleaning properties.

In order to further improve the crystallization of these layers, it is possible to envision, directly underneath the layer based on titanium oxide, an underlayer which has the effect of promoting crystal growth of the titanium oxide, in particular in anatase form. It made in particular be an underlayer of $ZrO_2$, as described in application WO 02/40417, or else an underlayer which promotes heteroepitaxial growth of the titanium oxide in anatase form, as described, for example, in application WO 2005/040058, in particular a layer of $BaTiO_3$ or $SrTiO_3$. Other underlayers may be inserted between the substrate and the layer of titanium dioxide. They may, for example, be layers which are barriers against the migration of alkalis, in particular layers based on $SiO_2$, on SiOC, on alumina $Al_2O_3$, or on silicon nitride $Si_3N_4$.

Other functional layers may be treated according to the invention. Mention may be made, in a nonlimiting manner, of metal layers, in particular layers of silver or of molybdenum, or else oxide layers, in particular layers of transparent electrically conductive oxide (for example layers of indium tin oxide, layers of zinc oxide doped with aluminum or with gallium, layers of tin oxide doped with fluorine or with antimony, etc).

The functional layer may be obtained by means of any type of thin-layer deposition process. This may, for example, involve processes of sol-gel type, (liquid or solid) pyrolysis, chemical vapor deposition (CVD), in particular plasma-enhanced chemical vapor deposition (PECVD), optionally under atmospheric pressure (APPECVD), evaporation, sputtering, in particular magnetron sputtering (magnetron process). In the latter process, a plasma is created under strong vacuum in the region of a target comprising the chemical elements to be deposited. The active species of the plasma, while bombarding the target, tear off said elements, which are deposited on the substrate, forming the desired thin layer. This process is termed "reactive" when the layer consists of a material resulting from a chemical reaction between the elements torn from the target and the gas contained in the plasma. The major advantage of this process lies in the possibility of depositing, on the same line, a very complex stack of layers by successively making the substrate run under various targets, generally in one and the same device.

The sacrificial layer may be organically and/or inorganically based. It is chosen for its capacity, on the one hand, to absorb the radiation used for the heat treatment and thus to enable the heating of the functional layer and, on the other hand, to be easily removed by means of a solvent.

The sacrificial layer may change in chemical nature during the heat treatment. In certain embodiments, the sacrificial layer as deposited is not soluble in a solvent, but becomes so after the heat treatment.

According to a first preferred embodiment, the sacrificial layer is a layer of a metal chosen from Zn and Mg, which at least partially oxidizes during the heat treatment, or a layer of zinc oxide or magnesium oxide which is sub-stoichiometric with respect to oxygen.

This layer is preferably deposited by magnetron sputtering.

After at least partial oxidation to $ZnO_x$ or $MgO_x$, the sacrificial layer can be easily removed by simple contact with an acidic aqueous solution. By way of example, an aqueous solution containing 2% to 5% of acetic acid or of citric acid makes it possible to rapidly remove such layers.

The thickness of this type of sacrificial layer is preferably included in a range of from 5 to 50 nm, in particular from 5 to 20 nm.

According to a second embodiment, the sacrificial layer is an organically based layer containing dyes or pigments.

The term "organically based" is intended to mean the fact that the layer comprises at least 30%, in particular 50%, by weight of organic matter.

The organically based layer is preferably deposited by liquid deposition techniques using inks, or more generally liquid solutions containing dyes or pigments of organic, vegetable or inorganic origin, dispersed or dissolved in a solvent.

Pigments which absorb infrared radiation are in particular carbon black, lampblack, iron oxide, chromium oxide, chromium spinels (for example $FeCr_2O_4$, $MgCr_2O_4$, $ZnCr_2O_4$) or else ytterbium salts. Pigments which absorb ultraviolet radiation are in particular chosen from metal salts, cerium oxide or cerium sulfide.

Dyes which absorb infrared radiation are in particular chosen from cyanine, metal complexes (Ni, Fe, Pt, Pd, etc) comprising a dithiolene ligand, and organometallic complexes of ytterbium. Dyes which absorb ultraviolet radiation are in particular chosen from rhodamine, phthalocyanine, coumarin and fluorescein.

The organically based layer may be deposited by various known techniques, such as deposition by coating, by spray coating, roll coating, curtain coating, etc.

After heat treatment, the organically based layer can be easily removed by simple washing with an appropriate solvent. It is understood that, in the case of an organically based sacrificial layer, some of its constituents, such as the pigments, may remain insoluble in the solvent without however being detrimental to the total removal of said sacrificial layer.

In one preferred embodiment, the process is a process for obtaining a material comprising a substrate coated on at least one part of at least one of its faces with a porous silica layer, said process comprising:
a step of depositing a silica-based layer containing silicon, oxygen, carbon and optionally hydrogen, then
a step of depositing a sacrificial layer of a metal chosen from Zn and Mg or of an organically based sacrificial layer containing dyes or pigments, on the silica-based layer, then
a step of heat treatment by means of laser radiation or of radiation from at least one flash lamp, said radiation having at least one wavelength of between 200 and 2500 nm, the heat treatment step at least partially removing the carbon and the hydrogen from the silica-based layer so as to form a porous layer essentially consisting of silica, said sacrificial layer being in contact with the air during this heat treatment step, then
a step of removing the sacrificial layer using a solvent.

The heat treatment uses laser radiation or radiation from at least one flash lamp, said radiation having a treatment wavelength of between 200 and 2500 nm, preferably between 800 and 1300 nm.

Throughout the heat treatment step, the temperature at any point on the face of the substrate opposite the face bearing the functional layer is preferably at most 150° C., in particular 100° C. and even 50° C.

The maximum temperature to which each point of the functional layer is subjected during the heat treatment is preferably at least 300° C., in particular 350° C., or even 400° C., and even 500° C. or 600° C. During the heat treatment step, each point of the functional layer is subjected to this maximum temperature for a period not generally exceeding one second, preferably 0.5 second.

According to a first preferred embodiment, the radiation is from at least one flash lamp.

Such lamps are generally in the form of sealed glass or quartz tubes filled with a rare gas, provided with electrodes at their ends. Under the effect of an electric pulse of short duration, obtained by discharge of a condenser, the gas ionizes and produces a particularly intense incoherent light. The emission spectrum generally comprises at least two emission lines; it is preferably a continuous spectrum which has a maximum emission in the near ultraviolet and extending up to the near infrared. In this case, the heat treatment uses a continuum of treatment wavelengths.

The lamp is preferably a xenon lamp. It may also be an argon, helium or krypton lamp. The emission spectrum preferably comprises several lines, in particular at wavelengths ranging from 160 to 1000 nm.

The duration of the flash is preferably included in a range of from 0.05 to 20 milliseconds, in particular from 0.1 to 5 milliseconds. The rate of repetition is preferably included in a range of from 0.1 to 5 Hz, in particular from 0.2 to 2 Hz.

The radiation may be from several lamps placed side by side, for example 5 to 20 lamps, or else 8 to 15 lamps, so as to simultaneously treat a wider area. All the lamps may in this case emit flashes simultaneously.

The or each lamp is preferably placed transversely to the largest sides of the substrate. The or each lamp has a length preferably of at least 1 m, in particular 2 m and even 3 m so as to be able to treat substrates of large size.

The condenser is typically charged at a voltage of 500 V to 500 kV. The current density is preferably at least 4000 $A/cm^2$. The density of total energy emitted by the flash lamps, related to the surface area of the coating, is preferably between 1 and 100 $J/cm^2$, in particular between 1 and 30 $J/cm^2$, or even between 5 and 20 $J/cm^2$.

According to a second preferred embodiment, the radiation is laser radiation, in particular laser radiation focused on the functional layer in the form of at least one laser line.

The laser radiation is preferably generated by modules comprising one or more laser sources and also forming and redirecting optics.

The laser sources are typically laser diodes or fiber lasers, in particular fiber, diode or else disk lasers. Laser diodes make it possible to economically achieve high power densities with respect to the electrical supply power for a small space requirement. The space requirement of fiber lasers is even smaller, and the linear power density obtained may be even higher, for a cost that is however greater. The term "fiber lasers" is intended to mean lasers in which the place where the laser light is generated is spatially removed from the place to which it is delivered, the laser light being delivered by means of at least one optical fiber. In the case of a disk laser, the laser light is generated in a resonating cavity in which the emitting medium, which is in the form of a disk, for example a thin disk (approximately 0.1 mm thick), of Yb:YAG, is contained. The light thus generated is coupled in at least one optical fiber directed toward the place of treatment. Fiber or disk lasers are preferably optically pumped using laser diodes.

The radiation resulting from the laser sources is preferably continuous.

The wavelength of the laser radiation, and therefore the treatment wavelength, is preferably included in a range of from 800 to 1300 nm, in particular from 800 to 1100 nm. High-power laser diodes that emit at one or more wavelengths chosen from 808 nm, 880 nm, 915 nm, 940 nm or 980 nm have proved particularly suitable. In the case of a disk laser, the treatment wavelength is for example 1030 nm (emission wavelength for a Yb:YAG laser). For a fiber laser, the treatment wavelength is typically 1070 nm.

In the case of non-fiber lasers, the forming and redirecting optics preferably comprise lenses and mirrors, and are used as means for positioning, homogenizing and focusing the radiation.

The purpose of the positioning means is, where appropriate, to arrange the radiation emitted by the laser sources along a line. They preferably comprise mirrors. The purpose of the homogenization means is to superpose the spatial profiles of the laser sources in order to obtain a homogeneous linear power density along the whole of the line. The homogenization means preferably comprise lenses that enable the separation of the incident beams into secondary beams and the recombination of said secondary beams into a homogeneous line. The radiation-focusing means make it possible to focus the radiation on the coating to be treated, in the form of a line of desired length and width. The focusing means preferably comprise a focusing mirror or a convergent lens.

In the case of fiber lasers, the forming optics are preferably grouped together in the form of an optical head positioned at the outlet of the or each optical fiber.

The forming optics of said optical heads preferably comprise lenses, mirrors and prisms, and are used as means for converting, homogenizing and focusing the radiation.

The converting means comprise mirrors and/or prisms and serve to convert the circular beam, obtained at the outlet of the optical fiber, into an anisotropic non-circular beam, in the shape of a line. For this, the converting means increase the quality of the beam according to one of its axes (rapid axis, or axis of width l of the laser line) and reduce the quality of the beam according to the other (slow axis, or axis of length L of the laser line).

The homogenization means superpose the spatial profiles of the laser sources in order to obtain a homogeneous linear power density along the whole of the line. The homogenization means preferably comprise lenses that enable the separation of the incident beams into secondary beams and the recombination of said secondary beams into a homogeneous line.

Finally, the radiation-focusing means make it possible to focus the radiation at the level of the working plane, i.e. in the plane of the coating to be treated, in the form of a line of desired length and width. The focusing means preferably comprise a focusing mirror or a convergent lens.

When a single laser line is used, the length of the line is advantageously equal to the width of the substrate. This length is typically at least 1 m, in particular 2 m and even 3 m. It is also possible to use several lines, separated or not separated, but positioned so as to treat the entire width of the substrate. In this case, the length of each laser line is preferably at least 10 cm or 20 cm, in particular within a range extending from 30 to 100 cm, in particular from 30 to 75 cm, or even from 30 to 60 cm.

The term "length" of the line is intended to mean the largest dimension of the line, measured on the surface of the coating in the first direction, and the term "width" is intended to mean the dimension along the second direction. As is customary in the field of lasers, the width w of the line corresponds to the distance (along this second direction) between the axis of the beam (where the intensity of the radiation is at a maximum) and the point where the intensity of the radiation is equal to $1/e^2$ times the maximum intensity. If the longitudinal axis of the laser line is referred to as x, it is possible to define a width distribution along this axis, referred to as w(x).

The mean width of the or each laser line is preferably at least 35 micrometers, in particular within a range extending from 40 to 100 micrometers or from 40 to 70 micrometers. Throughout the present text the term "mean" is intended to mean the arithmetic mean. Over the entire length of the line, the width distribution is narrow in order to limit as far as possible any treatment heterogeneity. Thus, the difference between the largest width and the smallest width is preferably at most 10% of the value of the mean width. This number is preferably at most 5% and even 3%.

The forming and redirecting optics, in particular the positioning means, may be adjusted manually or with the aid of actuators that make it possible to adjust their positioning remotely. These actuators (typically piezoelectric motors or blocks) may be controlled manually and/or be adjusted automatically. In the latter case, the actuators will preferably be connected to detectors and also to a feedback loop.

At least part of the laser modules, or even all of them, is preferably arranged in a leaktight box, which is advantageously cooled, in particular ventilated, so as to ensure their heat stability.

The laser modules are preferably mounted on a rigid structure referred to as a "bridge", based on metallic elements, typically made of aluminum. The structure preferably does not comprise a marble slab. The bridge is preferably positioned parallel to the conveying means so that the focal plane of the or each laser line remains parallel to the surface of the substrate to be treated. Preferably, the bridge comprises at least four feet, the height of which can be individually adjusted in order to ensure a parallel positioning in all circumstances. The adjustment may be provided by motors located at each foot, either manually or automatically, in connection with a distance sensor. The height of the bridge may be adapted (manually or automatically), in order to take into account the thickness of the substrate to be treated, and to thus ensure that the plane of the substrate coincides with the focal plane of the or each laser line.

The linear power density of the laser line is preferably at least 300 W/cm, advantageously 350 or 400 W/cm, in particular 450 W/cm, or even 500 W/cm and even 550 W/cm. It is even advantageously at least 600 W/cm, in particular 800 W/cm, or even 1000 W/cm. The linear power density is measured at the place where the or each laser line is focused on the coating. It may be measured by placing a power detector along the line, for example a calorimetric power meter, such as in particular the Beam Finder S/N 2000716 power meter from the company Coherent Inc. The power is advantageously distributed homogeneously over the entire length of the or each line. Preferably, the difference between the highest power and the lowest power is equal to less than 10% of the mean power.

The energy density provided to the coating is preferably at least 20 J/cm$^2$, or even 30 J/cm$^2$.

The high powers and energy densities make it possible to heat the coating very rapidly, without significantly heating the substrate.

As previously mentioned, the maximum temperature to which each point of the coating is subjected during the heat treatment is preferably at least 300° C., in particular 350° C., or even 400° C., and even 500° C. or 600° C. The maximum temperature is in particular experienced when the point of the coating in question passes under the laser line or is irradiated by the flash of the flash lamp. At a given instant, only the points of the surface of the coating located under the laser line or under the flash lamp and in the immediate vicinity thereof (for example less than one millimeter away) are normally at a temperature of at least 300° C. For distances to the laser line (measured along the running direction) of greater than 2 mm, in particular 5 mm, including downstream of the laser line, the temperature of the coating is normally at most 50° C., and even 40° C. or 300° C.

Each point of the coating is subjected to the heat treatment (or is brought to the maximum temperature) over a time advantageously included in a range of from 0.05 to 10 ms, in particular from 0.1 to 5 ms, or from 0.1 to 2 ms. In the case of a treatment by means of a laser line, this time is set both by the width of the laser line and by the speed of relative displacement between the substrate and the laser line. In the case of a treatment by means of a flash lamp, this time corresponds to the time of the flash.

The laser radiation is partly reflected by the coating to be treated and partly transmitted through the substrate. For safety reasons, it is preferable to place radiation-stopping means in the path of these reflected and/or transmitted radiations. These radiation-stopping means will typically be metal boxes cooled by circulation of fluid, in particular water. To prevent the reflected radiation from damaging the laser modules, the axis of propagation of the or each laser line forms a preferably non-zero angle with the normal to the substrate, typically an angle between 5° and 20°.

In order to improve the effectiveness of the treatment, it is preferable for at least one portion of the (main) laser radiation transmitted through the substrate and/or reflected by the coating to be redirected in the direction of said substrate in order to form at least one secondary laser radiation, which preferably impacts the substrate at the same location as the main laser radiation, advantageously with the same focus depth and the same profile. The formation of the or each secondary laser radiation advantageously uses an optical assembly comprising only optical elements selected from mirrors, prisms and lenses, in particular an optical assembly consisting of two mirrors and a lens, or of a prism and a lens. By recovering at least one portion of the main radiation lost and by redirecting it toward the substrate, the heat treatment is considerably improved thereby. The choice of using the portion of the main radiation transmitted through the substrate ("transmission" mode) or the portion of the main radiation reflected by the coating ("reflection" mode), or optionally of using both, depends on the nature of the layer and on the wavelength of the laser radiation.

When the substrate is moving, in particular translationally, it may be moved using any mechanical conveying means, for example using belts, rollers or trays running translationally. The conveying system makes it possible to control and regulate the run speed. The conveying means preferably comprises a rigid chassis and a plurality of rollers. The pitch of the rollers is advantageously within a range extending from 50 to 300 mm. The rollers preferably comprise metal rings, typically made of steel, covered with plastic wrappings. The rollers are preferably mounted on bearings with reduced clearance, typically in a proportion of three rollers per bearing. In order to ensure perfect flatness of the conveying plane, the positioning of each of the rollers is advantageously adjustable. The rollers are preferably moved using pinions or chains, preferably tangential chains, driven by at least one motor.

The speed of the relative displacement movement between the substrate and the or each radiation source (in particular the or each laser line) is advantageously at least 2 m/min, in particular 5 m/min and even 6 m/min or 7 m/min, or else 8 m/min and even 9 m/min or 10 m/min. According to certain embodiments, in particular when the absorption of the radiation by the coating is high or when the coating may be deposited with high deposition rates, the speed of the relative displacement movement between the substrate and the radiation source (in particular the or each laser line or flash lamp) is at least 12 m/min or 15 m/min, in particular 20 m/min and even 25 or 30 m/min. In order to ensure a treatment that is as homogeneous as possible, the speed of the relative displacement movement between the substrate and the or each radiation source (in particular the or each laser line or flash lamp) varies during the treatment by at most 10% in relative terms, in particular 2% and even 1% with respect to its nominal value.

Preferably, the or each radiation source (in particular laser line or flash lamp) is fixed, and the substrate moves, so that the speeds of relative displacement will correspond to the running speed of the substrate.

The heat treatment device may be integrated into a layer deposition line, for example a magnetron sputtering deposition (magnetron process) line or a chemical vapor deposition (CVD) line, in particular a plasma-enhanced chemical vapor deposition (PECVD) line, under vacuum or at atmospheric pressure (APPECVD). In general, the line includes substrate handling devices, a deposition unit, optical control devices and stacking devices. For example, the substrates run on conveyor rollers, in succession past each device or each unit.

The heat treatment device is preferably located just after the coating deposition unit, for example at the exit of the deposition unit. The coated substrate may thus be treated in line after the coating has been deposited, at the exit of the deposition unit and before the optical control devices, or after the optical control devices and before the substrate stacking devices.

The heat treatment device may also be integrated into the deposition unit. For example, the laser or the flash lamp may be introduced into one of the chambers of a sputtering deposition unit, in particular into a chamber in which the atmosphere is rarefied, in particular at a pressure between $10^{-6}$ mbar and $10^{-2}$ mbar. The heat treatment device may also be placed outside the deposition unit, but so as to treat a substrate located inside said unit. It is sufficient to provide, for this purpose, a window transparent to the wavelength of the radiation used, through which the radiation passes to treat the layer. It is thus possible to treat a layer (for example a silver layer) before the subsequent deposition of another layer in the same unit.

Whether the heat treatment device is outside the deposition unit or integrated thereinto, these "in-line" processes are preferable to a process involving off-line operations, in which it would be necessary to stack the glass substrates between the deposition step and the heat treatment.

However, processes involving off-line operations may have an advantage in cases in which the heat treatment according to the invention is carried out in a place different from that where the deposition is carried out, for example in a place where conversion of the glass takes place. The heat treatment device may therefore be integrated into lines other than the layer deposition line. For example, it may be integrated into a multiple glazing (in particular double or triple glazing) manufacturing line, into a laminated glazing manufacturing line, or else into a curved and/or dip-coated glazing manufacturing line. Laminated or curved or dip-coated glazing may be used both as building glazing or motor vehicle glazing. In these various cases, the heat treatment according to the invention is preferably carried out before the multiple glazing or laminated glazing is produced. The heat treatment may however be carried out after the double glazing or the laminated glazing is produced.

The heat treatment device is preferably positioned in a closed chamber that makes it possible to protect people by preventing any contact with the radiation and to prevent any pollution, in particular of the substrate, optics, or treatment zone.

A subject of the invention is also a material which can be obtained by means of the process according to the invention.

Such a material can then be integrated into a glazing, for example a multiple (double, triple, etc) glazing. In the case of the self-cleaning layers based on titanium oxide, the material may in particular constitute the first sheet of a multiple glazing, the functional layer being placed on face 1 of said glazing. Such a material may also be integrated into a photovoltaic cell. In the case of the antireflection silica-based layers as previously mentioned, the material which is coated therewith can form the front face of a photovoltaic cell.

The invention is illustrated with the aid of the following nonlimiting exemplary embodiments.

A layer of silica 150 nm thick containing 45% by volume of poly(methyl methacrylate) (PMMA) beads approximately 70 nm in diameter was deposited, via the sol-gel liquid process, on a principal face of a soda-lime-silica glass substrate obtained by the float process then cut into a rectangular shape with a length L=6 m and a width l=3.3 m.

The colorimetric coordinates in reflection of this layer are the following: $L^*=30.45$; $a^*=0.03$; $b^*=-1.13$, for a light reflection factor of 8% (taking into account the reflection of the uncoated face). This type of layer is intended to form an antireflection porous silica layer after removal of the PMMA beads.

A coating approximately 5 μm thick, consisting of an ink-jet printing ink sold under the reference LF-140 Black by the company Mimaki Engineering and which absorbs in the near infrared, was roll-deposited on top of the layer of silica.

The substrate thus coated was then treated using a laser line formed from laser sources of InGaAs laser diode type, virtually continuous sources emitting at a wavelength of between 900 and 1000 nm. The laser line has a length of 3.3 m, equal to the width l of the substrate, and a mean width of 50 μm.

The substrate was placed on a conveyor belt so as to run in a direction X, parallel to its length. The laser line was fixed and placed on top of the coated surface of the substrate with its longitudinal direction Y extending perpendicularly to the running direction X of the substrate, i.e. along the width of the substrate, while extending over this entire width.

The position of the focal plane of the laser line was adjusted so as to be located within the thickness of the layer of ink when the substrate was placed on the conveyor, the surface power of the laser line at the level of the focal plane being $10^5$ W/cm$^2$.

The substrate was made to run under the laser line at a speed of 8 m/min.

After treatment, the ink was removed by passing through a washing machine.

The colorimetric coordinates after treatment are the following: $L^*=27.80$; $a^*=-0.18$; $b^*=0.65$, for a light reflection factor of 5%, values corresponding to the values obtained after a thermal tempering treatment.

In one comparative example, the same heat treatment was applied to the same layer of silica, but not covered with an ink. In this case, the PMMA beads are not removed by the treatment, so that the characteristics in reflection are unchanged.

The invention claimed is:

1. A process for obtaining a material comprising a substrate coated on at least one part of at least one of its faces with at least one functional layer, said process comprising:
   depositing the at least one functional layer; then
   depositing a sacrificial layer on the at least one functional layer; then
   heat treating the at least one functional layer and the sacrificial layer with radiation, which is laser radiation or radiation from at least one flash lamp, the radiation having at least one treatment wavelength between 200 and 2500 nm, the sacrificial layer being in contact with the air during the heat treating; and then
   removing the sacrificial layer by contacting with a solvent, thereby obtaining the substrate coated on at least one part of at least one of its faces with the at least one functional layer,
   wherein the sacrificial layer is a monolayer that, before heat treatment, is capable of absorbing at least one part of the radiation at said at least one treatment wavelength, and
   wherein the sacrificial layer is capable of being removed after heat treatment by dissolution and/or dispersion in the solvent.

2. The process of claim 1, wherein the solvent is aqueous.

3. The process of claim 1, wherein the substrate is glass or glass-ceramic.

4. The process of claim 1, wherein an absorption of the at least one functional layer at the at least one treatment wavelength is at most 10%.

5. The process of claim 4, wherein the at least one functional layer is a layer based on titanium oxide.

6. The process of claim 1, wherein the at least one functional layer is a silica-based layer.

7. The process of claim 6, wherein the silica-based layer comprises, before the heat treating, a silica matrix and an organic pore-forming agent, and wherein the heat treating comprises removing the pore-forming agent, thereby obtaining a porous layer essentially consisting of silica.

8. The process of claim 7, wherein the organic pore-forming agent is a polymer.

9. The process of claim 8, wherein the organic pore-forming agent is poly(methyl methacrylate).

10. The process of claim 1, wherein the sacrificial layer is a layer of a metal selected from the group consisting of Zn and Mg, which at least partially oxidizes during the heat treating, or a layer of zinc oxide or magnesium oxide which is sub-stoichiometric with respect to oxygen.

11. The process of claim 1, wherein the sacrificial layer is an organically based layer comprising a dye and/or a pigment.

12. The process of claim 1, wherein, during the heat treating, each point of the functional layer is subjected to a maximum temperature of at least 300° C. for a period not exceeding one second.

13. The process of claim 1, wherein the radiation is laser radiation focused on the functional layer as at least one laser line.

14. The process of claim 1, wherein the process does not comprise depositing a soluble underlayer between the functional layer and the sacrificial layer.

15. The process of claim 1, wherein the radiation is laser radiation, and wherein the heat treating comprises redirecting laser radiation transmitted through the substrate and/or reflected by the at least one functional layer back in the direction of the substrate in order to provide at least one secondary laser radiation to the functional layer.

16. The process of claim 1, wherein a light reflection factor of the functional layer after the sacrificial layer is removed is lower than a light reflection factor of the functional layer before the heat treating.

17. A process for obtaining a material comprising a substrate coated on at least one part of at least one of its faces with at least one functional layer, the process comprising:

heat treating, with radiation, a coated substrate that comprises a substrate, the at least one functional layer deposited on the substrate, and a sacrificial layer deposited on the at least one functional layer, thereby heating the at least one functional layer and the sacrificial layer, wherein the radiation is laser radiation or radiation from at least one flash lamp, the radiation having at least one treatment wavelength between 200 and 2500 nm, the sacrificial layer being in contact with the air during the heat treating; and then removing the sacrificial layer by contacting with a solvent, thereby obtaining the substrate coated on at least one part of at least one of its faces with the at least one functional layer, wherein the sacrificial layer is a monolayer that, before heat treatment, is capable of absorbing at least one part of the radiation at the at least one treatment wavelength, and wherein the sacrificial layer is capable of being removed after heat treatment by dissolution and/or dispersion in the solvent.

* * * * *